(12) United States Patent
Iwaki (10) Patent No.: US 9,318,159 B2
(45) Date of Patent: Apr. 19, 2016

(54) SEMICONDUCTOR DEVICE (71) Applicant: PS4 LUXCO S.A.R.L., Luxembourg (LU)

(72) Inventor: Hiroaki Iwaki, Tokyo (JP)

(73) Assignee: PS4 Lucxo S.a.r.l., Luxembourg (LU)

( * ) Notice: Subject to any disclaimer, the term of this patent is extended or adjusted under 35 U.S.C. 154(b) by 0 days.

(21) Appl. No.: 13/777,818

(22) Filed: Feb. 26, 2013

(65) Prior Publication Data

US 2013/0235641 A1 Sep. 12, 2013

(30) Foreign Application Priority Data

Mar. 6, 2012 (JP) .................................. 2012-048942

(51) Int. Cl.
*G11C 5/06* (2006.01)
*G11C 11/4097* (2006.01)
*H01L 27/02* (2006.01)
*H01L 27/108* (2006.01)
*H01L 23/522* (2006.01)

(52) U.S. Cl.
CPC *G11C 5/063* (2013.01); *G11C 5/06* (2013.01); *G11C 11/4097* (2013.01); *H01L 23/5222* (2013.01); *H01L 27/0207* (2013.01); *H01L 27/10811* (2013.01); *H01L 27/10885* (2013.01); *H01L 27/10876* (2013.01); *H01L 2924/0002* (2013.01)

(58) Field of Classification Search
CPC ........ G11C 7/18; G11C 11/4097; G11C 8/14; G11C 29/873; G11C 5/10; G11C 5/06; G11C 14/0009; G11C 5/02; G11C 8/08

USPC ............... 365/189.011; 377/51, 63, 158, 185, 377/197, 205, 206, 207, 230

See application file for complete search history.

(56) References Cited

U.S. PATENT DOCUMENTS

| | | | | |
|---|---|---|---|---|
| 6,088,283 | A * | 7/2000 | Hayashi | 365/230.03 |
| 6,215,692 | B1 * | 4/2001 | Kang | 365/145 |
| 7,821,805 | B2 * | 10/2010 | Hirose | 365/63 |
| 2010/0090337 | A1 * | 4/2010 | Patel et al. | 257/734 |
| 2011/0026292 | A1 * | 2/2011 | Narui | 365/63 |
| 2011/0026348 | A1 * | 2/2011 | Narui | 365/210.1 |
| 2011/0205820 | A1 * | 8/2011 | Takayama et al. | 365/200 |
| 2012/0092946 | A1 * | 4/2012 | Kim et al. | 365/203 |
| 2013/0016557 | A1 * | 1/2013 | Kim | 365/163 |

FOREIGN PATENT DOCUMENTS

| | | | |
|---|---|---|---|
| JP | 2003282841 | A | 10/2003 |
| JP | 2009-33029 | A | 2/2009 |
| JP | 2010055730 | A | 3/2010 |
| JP | 2011154754 | A | 8/2011 |

OTHER PUBLICATIONS

Lecture 15 Handout-Interconnect, 6.152J/3.155J SpringTerm.*

* cited by examiner

*Primary Examiner* — Shawki S Ismail
*Assistant Examiner* — Muhammad Islam (57) ABSTRACT

Disclosed herein is a semiconductor device including a multi-level wiring structure that includes a lower-level wiring, an upper-level wiring and an interlayer insulating film between the lower-level and upper-level wirings. The device further includes a plurality of bit lines for a plurality of memory cells, and each of the bit lines includes a first portion that is formed as the lower-level wiring and a second portion that is electrically connected in series to the first portion and formed as the upper-level wiring.

9 Claims, 9 Drawing Sheets

SEMICONDUCTOR DEVICE

This application is based upon and claims the benefit of priority from Japanese patent application No. 2012-048942, filed on Mar. 6, 2012, the disclosure of which is incorporated herein in its entirety by reference.

BACKGROUND OF THE INVENTION

1. Field of the Invention

The present invention relates to a semiconductor device.

2. Description of the Related Art

In a semiconductor device such as a conventional dynamic random access memory (DRAM), there has been known a hierarchical bit line structure in which a plurality of sub bit lines are provided for each of main bit lines. See, e.g., Japanese Unexamined Patent Application Publication (JP-A) No. 2009-33029 (Patent Literature 1).

Patent Literature 1 discloses a semiconductor device having a hierarchical bit line structure in which for adjacent main bit lines, main bit lines (MBL0-MBLn) are provided in a second metal wiring layer and the other main bit line (/MBL0-/MBLn) are provided in a third metal wiring layer, in order to prevent an initial differential potential to be inputted into a sense amplifier from being lowered due to an increase of a side coupling capacitance between the adjacent main bit lines, which is caused when wiring pitches (the sum of the line width and the space width of the wiring layers) are reduced. Specifically, in the semiconductor device disclosed in Patent Literature 1, main bit lines that are arranged adjacent to each other on a plane are provided in different layers, thereby preventing an increase of the side coupling capacitance between those main bit lines.

The semiconductor device disclosed in Patent Literature 1 suffers from a problem that a difference is produced in capacitance between the main bit lines MBL0-MBLn provided in the second metal wiring layer and the main bit lines /MBL0-/MBLn provided in the third metal wiring layer. For example, as shown in FIG. 4 of Patent Literature 1, each of the main bit lines MBL0-MBLn provided in the second metal wiring layer has a side coupling capacitance Cc2a between the main bit lines MBL and a capacitance between the main bit line and a wire (sub bit line SBL) provided in a first metal wiring layer located below the second metal wiring layer.

Each of the main bit lines /MBL0-/MBLn provided in the third metal wiring layer has a side coupling capacitance Cc3a between the main bit lines /MBL and a capacitance between the main bit line and a wire (word line WL) provided in a fourth metal wiring layer located above the third metal wiring layer. Therefore, the capacitance of the main bit lines MBL0-MBLn provided in the second metal wiring layer becomes different from the capacitance of the main bit lines /MBL0-/MBLn provided in the third metal wiring layer. Thus, a difference is produced in capacitance between the main bit lines.

As a result of the difference in capacitance between the main bit lines, upon reading data in the semiconductor device, initial potentials generated by data read from memory cells may vary between the main bit lines provided in the second metal wiring layer and the main bit lines provided in the third metal wiring layer.

Variations of the initial potentials make it difficult to match operation margins of sense amplifiers connected to the main bit lines provided in the second metal wiring layer with operation margins of sense amplifiers connected to the main bit lines provided in the third metal wiring layer. Therefore, it becomes difficult to design sense amplifiers as an operation speed of the semiconductor device increases.

SUMMARY

In one embodiment, there is provided a semiconductor device that comprises a first memory mat comprising a plurality of first memory cells, a second memory mat comprising a plurality of second memory cells, a first global bit line extending over the first memory mat and the second memory mat, and a multi-level wiring structure comprising a lower-level wiring, an upper-level wiring, and an interlayer insulation film between the lower-level wiring and the upper-level wiring, wherein the first global bit line includes a first portion over the first memory mat and a second portion over the second memory mat, and the first portion is formed as the lower-level wiring, whereas the second portion is formed as the upper-level wiring.

In another embodiment, such a semiconductor device is provided that comprises a multi-level wiring structure including a lower-level wiring, an upper-level wiring and an interlayer insulating film between the lower-level and upper-level wirings; a plurality sets of memory cells; and a plurality of bit lines each provided for an associated one of the sets of memory cells, each of the bit lines including a first portion that is formed as the lower-level wiring and a second portion that is electrically connected in series to the first portion and formed as the upper-level wiring.

In still another embodiment, there is provided a semiconductor device that comprises: a first memory mat that includes first and second sub-mats, first and second local bit lines provided for the first and second sub-mats, respectively, and first and second sets of memory cells connected to the first and second local bit lines, respectively; a multi-level wiring structure including a lower-level wiring, an upper-level wiring and an interlayer insulating film between the lower-level wiring and the upper-level wiring; and a first global bit line crossing over the first memory mat, the first global bit line including a first portion over the first sub-mat to be operatively connected to the first local bit line and a second portion over the second sub-mat to be operatively connected to the second local bit line, the first portion being formed as the lower-level wiring, and the second portion being formed as the upper-level wiring.

DETAILED DESCRIPTION OF EXEMPLARY EMBODIMENTS

A preferred embodiment of the present invention will be described in detail below with reference to the accompanying drawings.

Figure 1:
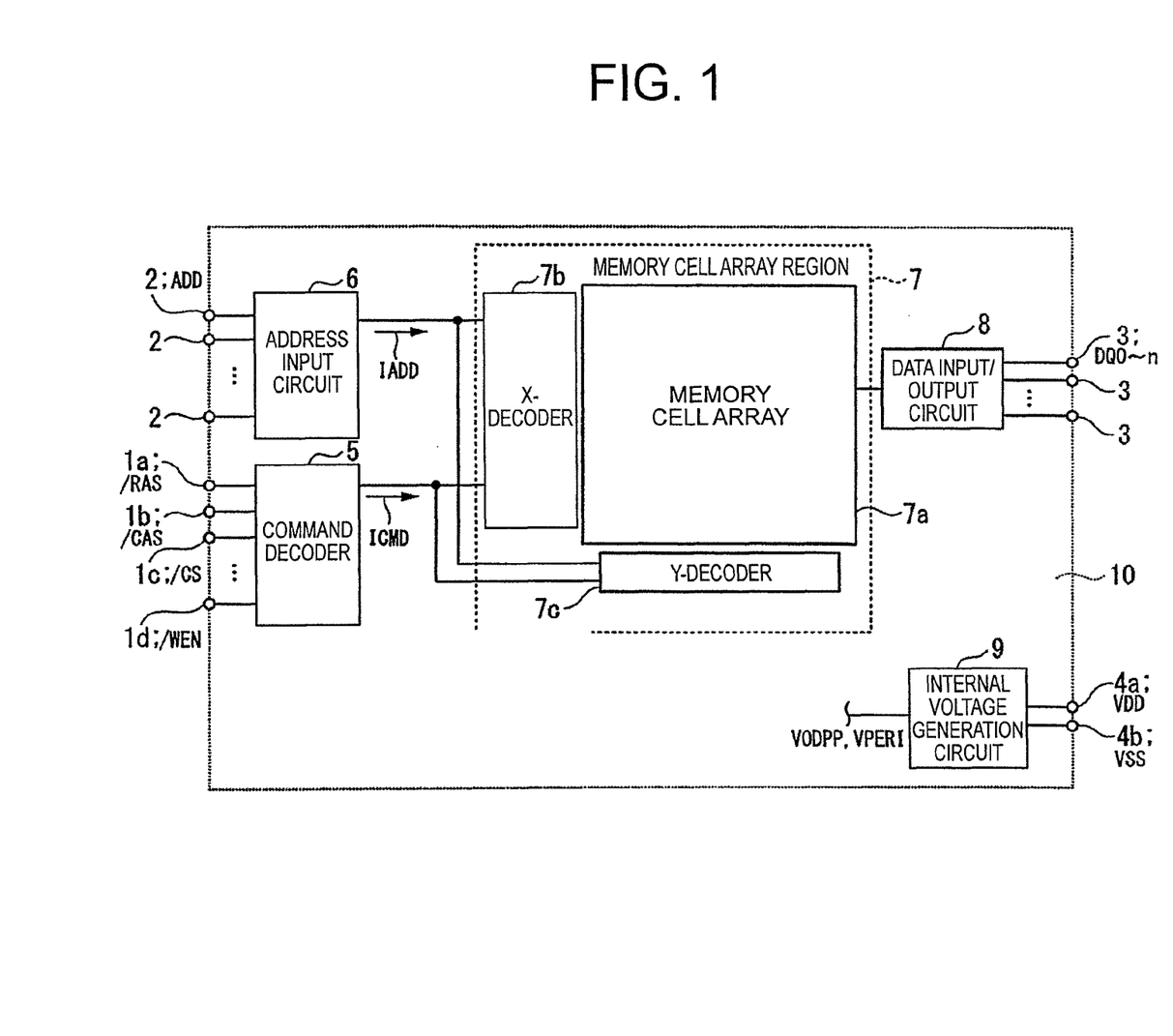
FIG. 1 is a block diagram showing an outlined arrangement of an exemplary embodiment of a semiconductor device 10.

FIG. 1 is a block diagram showing an outlined arrangement of a semiconductor device 10. All of circuit blocks illustrated in FIG. 1 are formed on the same semiconductor chip of monocrystalline silicon.

For example, each of the circuit blocks is formed by a plurality of transistors such as PMOS transistors (P-type channel MOS transistors) and NMOS transistors (N-type channel MOS transistors). Small circles represent pads as external terminals provided on the semiconductor chip.

The semiconductor device 10 includes a command decoder 5, an address input circuit 6, a memory cell array region 7, a data input/output circuit 8, and an internal voltage generation circuit 9. The memory cell array region 7 includes a memory cell array 7a, an X-decoder 7b, and a Y-decoder 7c. The detail of the memory cell array 7a, which is a characterized portion of the semiconductor device 10 according to the present invention, will be described later. First, a summary of the semiconductor device 10 will be described below.

The semiconductor device 10 has external terminals of command terminals 1a-1d, address terminals 2, data input/output terminals 3, and power source terminals 4a and 4b. The semiconductor device 10 also has other terminals such as a clock terminal, data strobe terminals, and a reset terminal, which are omitted from the illustration. In the specification, the signals with a prefix "/" are inverse signals of the corresponding signals or active-low signals.

The command terminals 1a-1d are supplied with a row address strobe signal /RAS, a column address strobe signal /CAS, a chip select signal /CS, and a write enable signal /WEN, respectively. A combination of signals inputted to those terminals forms command signals CMD. The command signals CMD are inputted into the command decoder 5. The command decoder 5 holds and decodes the command signals CMD to generate a variety of internal command signals ICMD. The generated internal command signals ICMD are inputted to the X-decoder 7b, which is one of row control circuits, and the Y-decoder 7c, which is one of column control circuits.

The address terminals 2 are supplied with address signals ADD. The supplied address signals ADD are inputted into the address input circuit 6. The address input circuit 6 latches the address signals ADD and outputs internal address signals IADD in accordance with the decoding results of the command decoder 5. A row address of the internal address signals IADD is inputted into the X-decoder 7b, and a column address of the internal address signals IADD is inputted into the Y-decoder 7c.

The X-decoder 7b is a circuit operable to select one of word lines included in the memory cell array 7a. The Y-decoder 7c is a circuit operable to select one of sense amplifiers included in the memory cell array 7a. For example, the sense amplifier selected by the Y-decoder 7c is connected to a data amplifier (not shown). During a reading operation, the data amplifier further amplifies read data amplified by the sense amplifier and outputs the read data to the data input/output circuit 8 via a read/write bus. During a writing operation, the data amplifier amplifies write data inputted from the data input/output circuit 8 via the read/write bus and outputs the write data to the sense amplifier.

The data input/output terminals 3 are used to output read data DQ and to input write data DQ and are connected to the data input/output circuit 8. During a reading operation, the data input/output circuit 8 outputs read data as read data DQ from the memory cell array 7a to the data input/output terminals 3 in parallel. During a writing operation, the data input/output circuit 8 outputs write data DQ from the data input/output terminal 3 to the memory cell array 7a in series. As shown in FIG. 1, the semiconductor device 10 has a plurality of data input/output terminals 3. The number of the data input/output terminals 3 may be four, eight, sixteen, or the like.

Figure 2:
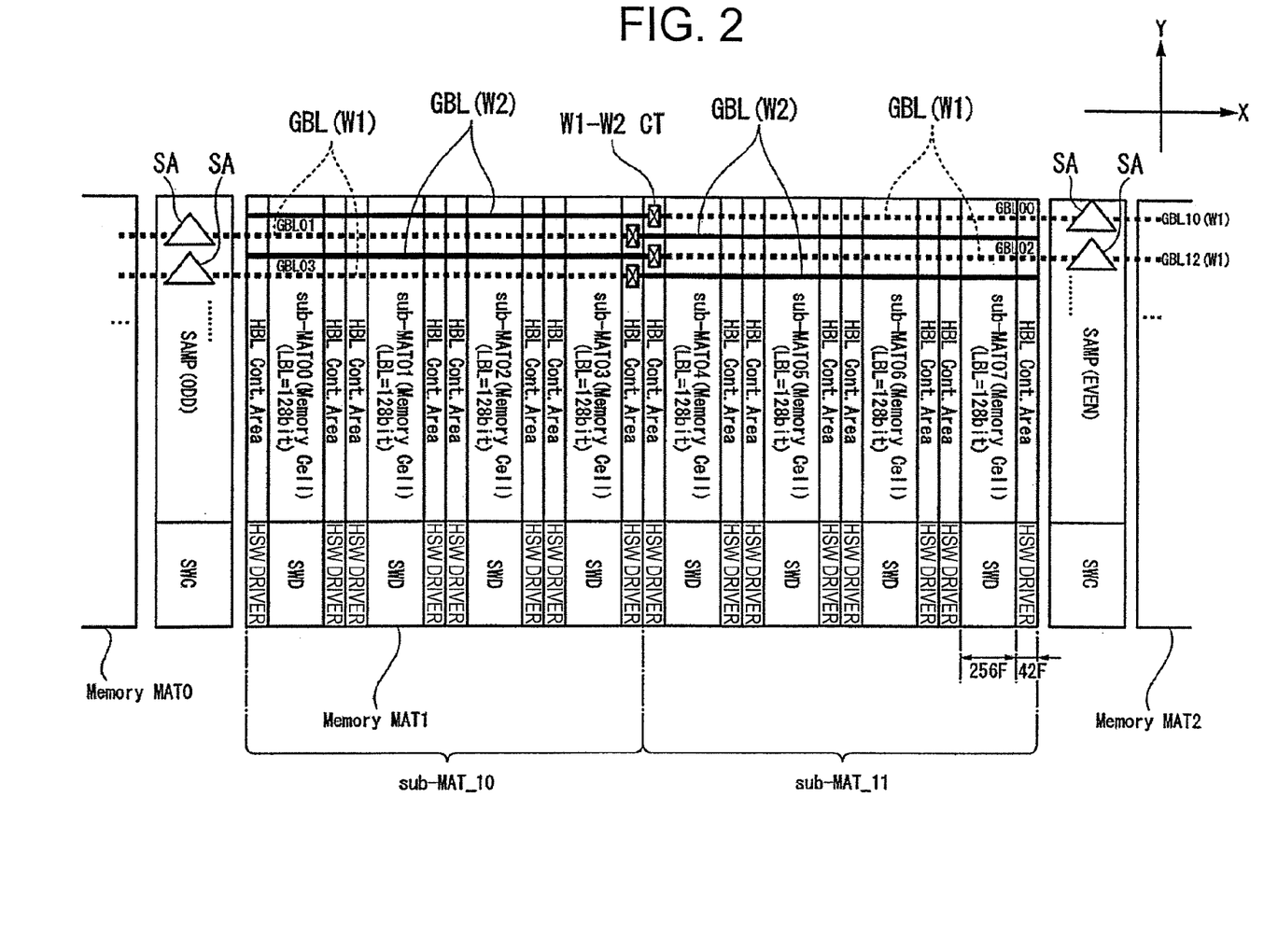
FIG. 2 is a diagram showing a schematic layout of a memory cell array 7a illustrated in FIG. 1.

The power source terminals 4a and 4b are supplied with an external voltage VDD and a ground voltage VSS, respectively. In the specification, any voltage between the external voltage VDD and the ground voltage VSS may be referred to as an "external voltage VDD." The power source terminals 4a and 4b are respectively connected to the internal voltage generation circuit 9. The external voltage VDD is supplied to the internal voltage generation circuit 9. The internal voltage generation circuit 9 generates a plurality of internal voltages corresponding to functions of respective internal circuits. For example, the internal voltage generation circuit 9 generates a first internal voltage VODPP (e.g., 1.6 V), a second internal voltage VPERI (e.g., 1.2 V), and the like. Each of those internal voltages is supplied to the corresponding internal circuit. Next, the memory cell array 7a, which is a characterized portion of the semiconductor device 10 according to the present invention, will be described in detail below. FIG. 2 is a diagram showing a schematic layout of the memory cell array 7a illustrated in FIG. 1.

The memory cell array 7a has a plurality of memory mats Memory MAT. Each of the memory mats Memory MAT includes a plurality of sub-memory mat areas sub-MAT00 to sub-MAT07. Furthermore, each of the memory mats Memory MAT includes a plurality of sub-word line driver areas SWD, a plurality of switching driver area HSW Driver, and a plurality of switching circuit areas HBL Cont. Area, each of which corresponds to one sub-memory mat area sub-MAT.

Furthermore, a sense amplifier area SAMP is provided between adjacent memory mats Memory MAT. Each of the sense amplifier areas SAMP includes a plurality of sense amplifier circuits SA.

A plurality of global bit lines GBL extending along the X-direction are provided on each of the memory mats Memory MAT. Those global bit lines GBL are alternately connected to the sense amplifier circuits SA arranged on the opposite sides. For example, the global bit line GBL00 and the global bit line GBL02 are connected to the sense amplifier circuits SA provided in the sense amplifier area SAMP (EVEN). The global bit line GBL01 and the global bit line GBL03 are connected to the sense amplifier circuits SA provided in the sense amplifier area SAMP (ODD).

Those global bit lines extending on each of the memory mats Memory MAT are provided in two divided layers. For example, a portion of the global bit line GBL00 that extends from the sub-memory mat area sub-MAT04 to the sub-memory mat area sub-MAT07 is provided as a global bit line GBL(W1) in a first wiring layer W1. A portion of the global bit line GBL00 that extends from the sub-memory mat area sub-MAT00 to the sub-memory mat area sub-MAT03 is provided as a global bit line GBL(W2) in a second wiring layer W2.

Thus, one global bit line extends in two divided layers of the first wiring layer W1 and the second wiring layer W2. In other words, each of the global bit lines has a portion extending in the first wiring layer W1 and a portion extending in the second wiring layer W2. This allows the capacitance of each of the global bit lines to be adjusted, the details of which will be described later with reference to FIGS. 7 and 8.

Hereinafter, the sub-memory mat areas sub-MAT00 to sub-MAT03 are collectively referred to as a sub-memory mat area sub-MAT_10, and the sub-memory mat areas sub-MAT04 to sub-MAT07 are collectively referred to as a sub-memory mat area sub-MAT_11. In this example, each of the sub-memory mat area sub-MAT_10 and the sub-memory mat area sub-MAT_11 has four sub-memory mat areas. Nevertheless, the number of sub-memory mat areas in each of the sub-memory mat area sub-MAT_10 and the sub-memory mat area sub-MAT_11 is not limited to four. Each of the sub-memory mat area sub-MAT_10 and the sub-memory mat area sub-MAT_11 has (M+1)/2 sub-memory mat areas where M is an odd number not less than 1. In the following description of this embodiment, it is assumed that M=7.

When the length of a portion of a global bit line that extends in the first wiring layer W1 and the length of a portion of the global bit line that extends in the second wiring layer W2 are made equal to each other as much as possible (for example, they are halved), variations in capacitance can substantially be reduced. Therefore, in the present embodiment, contact plugs W1-W2 CT are provided in the switching circuit areas HBL Cont. Area that are located at a boundary between the sub-memory mat area sub-MAT_10 and the sub-memory mat area sub-MAT_11. Each of those contact plugs W1-W2 CT connects the first wiring layer W1 and the second wiring layer W2 to each other. The contact plugs W1-W2 CT may be located at the positions illustrated in FIG. 2. Alternatively, the contact plugs W1-W2 CT may be located in dedicated areas, which will be described later.

Furthermore, with regard to the global bit line GBL01, which is located adjacent to the global bit line GBL00, a portion of the global bit line GBL01 that extends on the sub-memory mat area sub-MAT_10 is provided as a global bit line GBL(W1) in the first wiring layer W1. A portion of the global bit line GBL01 that extends on the sub-memory mat area sub-MAT_11 is provided as a global bit line GBL(W2) in the second wiring layer W2. Thus, no adjacent global bit lines are juxtaposed in the same layer. Therefore, the capacitance of the global bit lines is reduced, so that the sense amplifiers SA can operate at higher speeds. In the sub-memory mat area sub-MAT_10 (first area), the global bit line GBL00 and the global bit line GBL01 adjacent to the global bit line GBL00 are formed in the second wiring layer W2 and the first wiring layer W1, respectively, and are not located at the same height. Accordingly, the side coupling capacitance between the global bit line GBL00 and the global bit line GBL01 is reduced in the sub-memory mat area sub-MAT_10. Furthermore, in the sub-memory mat area sub-MAT_11 (second area), the global bit line GBL00 and the global bit line GBL01 are formed in the first wiring layer W1 and the second wiring layer W2, respectively, and are not located at the same height.

Accordingly, the side coupling capacitance between the global bit line GBL00 and the global bit line GBL01 is reduced in the sub-memory mat area sub-MAT_11. Thus, no adjacent global bit lines are juxtaposed in the same layer. Therefore, the capacitance of the global bit lines is reduced, so that the sense amplifiers SA can operate at higher speeds.

Figure 3:
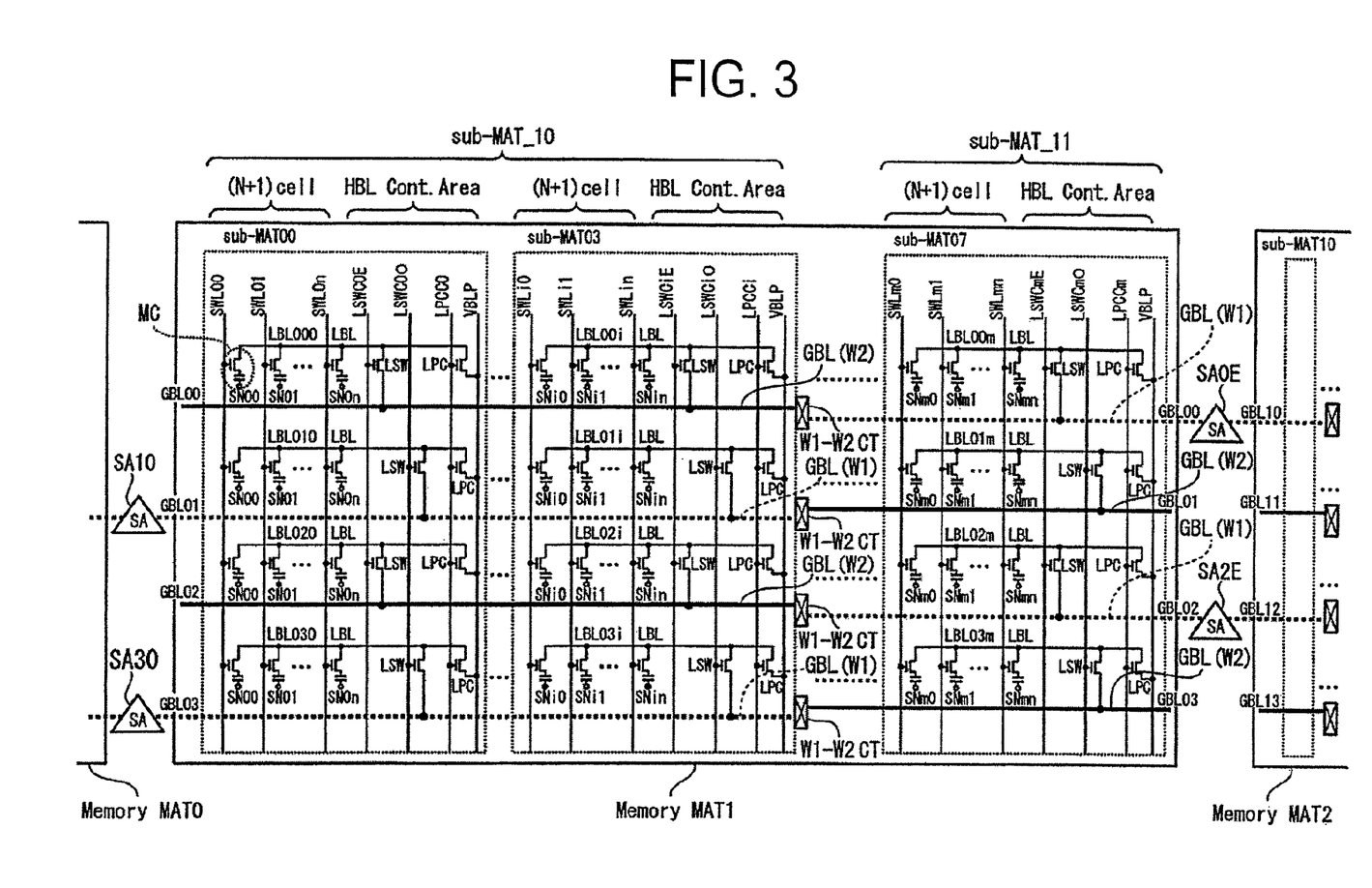
FIG. 3 is a detailed circuit diagram showing an example of a memory mat Memory MAT1 illustrated in FIG. 2.

Next, a detailed circuit configuration of the memory mat Memory MAT will be described. FIG. 3 is a detailed circuit diagram showing an example of the memory mat Memory MAT1 illustrated in FIG. 2.

Each of the sub-memory mat areas sub-MAT in the memory mat Memory MAT has a plurality of sub-word lines SWL, a plurality of local bit lines LBL, and a plurality of memory cells MC located at intersections of the sub-word lines SWL and the local bit lines LBL. A plurality of sub-word line drivers corresponding to those sub-word lines SWL are provided in each of the sub-word line driver areas SWD (see FIG. 2). The sub-word line drivers select a sub-word line SWL in accordance with the internal address signals IADD and the internal command signals ICMD. The memory cells MC include MOS transistors and storage capacitors SN (SN00, SN01, and the like). For example, if the sub-word line SWL00 is selected, the MOS transistors of the memory cells connected to the sub-word line SWL00 are turned on (brought into conduction), so that data stored in the storage capacitors SN00 are read into the local bit lines LBL corresponding to the MOS transistors (the local bit lines connected to the selected memory cells).

Switching circuits LSW (a first switching element to a fourth switching element), each of which connects the global bit line GBL to the corresponding local bit line LBL, are provided in the switching circuit area HBL Cont. Area. Furthermore, switching circuits LPC (a first precharge circuit to a fourth precharge circuit), each of which provides a bit line precharge voltage VBLP (a predetermined precharge potential) to the corresponding local bit line LBL, are provided in the switching circuit area HBL Cont. Area. The switching driver areas HSW Driver (see FIG. 2) include switching driver circuits operable to control the switching circuits LSW in accordance with the internal address signal IADD and the internal command signal ICMD. Those switching driver circuits may have any logical configuration. For example, when the sub-word line SWL00 is selected, a switching driver circuits bring a control signal LPCC0 from a high level (H level) to a low level (L level), so that the switching circuits LPC provided on the local bit lines LBL000 to the local bit line LBL030 are brought from an on-state (conduction) into an off-state (non-conduction). Thus, the switching circuits LPC (the precharge circuits provided on the local bit lines connected to the selected memory cells) electrically disconnect the local bit lines LBL00-LBL030 (a local bit line of the first local bit line and the third local bit line that is connected to the selected memory cells) from lines that supply the bit line precharge voltage VBLP and stop the precharging of those local bit lines. At that time, the switching driver circuits hold the control signals LPCC other than the control signal LPCC0 at a high level and hold an on-state of the switching circuits LPC (the precharge circuits provided on the local bit lines that are not connected to the selected memory cells). Thus, the switching circuits LPC hold an electric connection between the local bit lines LBL00i-LBL03i (a local bit line of the first local bit line and the third local bit line that is not connected to the selected memory cells, the second local bit line, and the fourth local bit line) and the lines that supply the bit line precharge voltage VBLP and continue the precharging of those local bit lines.

Furthermore, the switching driver circuits change control signals LSWC (LSWCiE, LSWCiO, and the like) other than a control signal LSWC0O and a control signal LSWC0E from a high level to a low level, so that the corresponding switching circuits LSW (switching elements provided on the local bit lines not connected to the selected memory cells) are turned off. Thus, the local bit lines LBL00i-LBL03i and the like are electrically disconnected from the global bit lines GBL00-GBL03 and the like, respectively.

Moreover, the switching driver circuits hold the control signal LSWC0E and the control signal LSWC0O at a high level, so that the corresponding switching circuits LSW (switching elements provided on the local bit lines connected to the selected memory cells) are held in an on-state. Thus, in the case where the sub-word line SWL00 is selected, the local bit lines LBL000-LBL030 are electrically connected to the global bit lines GBL00-GBL03, respectively, so that data of the memory cells are read into the respective global bit lines.

The memory mat Memory MAT0 and the memory mat Memory MAT2, which are located adjacent to the memory mat Memory MAT1, have the same configuration as the memory mat Memory MAT1. In the case where the sub-word line SWL00 of the memory mat Memory MAT1 is selected, each of the global bit lines GBL in the adjacent memory mat Memory MAT0 and the adjacent memory mat Memory MAT2 is held at a fixed potential. In other words, the switching driver circuits provided in each of the memory mats hold the control signal LSWC and the control signal LPCC at a high level. Accordingly, the global bit lines GBL are held at a bit line precharge voltage VBLP via the local bit lines by the switching circuits LPC provided in each of the memory mats.

Next, an operation in an example where the sub-word line SWL00 of the sub-memory mat area sub-MAT00 is selected will be described. When the sub-word line SWL00 of the sub-memory mat area sub-MAT00 is selected, memory cell transistors in the memory cells MC that have a gate electrode connected to the sub-word line SWL00 are turned on. Thus, data are read into the local bit lines LBL000-LBL030 from the respective storage capacitors SN00. At that time, each of the control signals LSWC0E and LSWC0O outputted from the switching driver circuits (not shown) is in an active state (at a high level). Therefore, the corresponding switching circuits LSW are in an on-state. Accordingly, the data read from the storage capacitors SN00 are transmitted from the local bit lines LBL000-LBL030 to the global bit lines GBL00-GBL03 via the switching circuits LSW.

Meanwhile, a global bit line GBL10 extending on the memory mat Memory MAT2, which is paired with the global bit line GBL00, and a global bit line GBL12 extending on the memory mat Memory MAT2, which is paired with the global bit line GBL02, are held at a precharge voltage VBLP. In the memory mat Memory MAT0, a global bit line paired with the global bit line GBL01 and a global bit line paired with global bit line GBL03 are held at a precharge voltage VBLP.

Each of the sense amplifiers SA0E, SA1O, SA2E, and SA3O shown in FIG. 3 amplifies a voltage difference between an initial differential potential based upon the data read into the global bit lines GBL00-GBL03 and a potential of the paired global bit line to thereby generate read data and then outputs the read data to a data amplifier (not shown). The data amplifier further amplifies the read data amplified by the sense amplifier and outputs the read data to the data input/output circuit 8 (see FIG. 1) via the read write bus (not shown).

Figure 4:
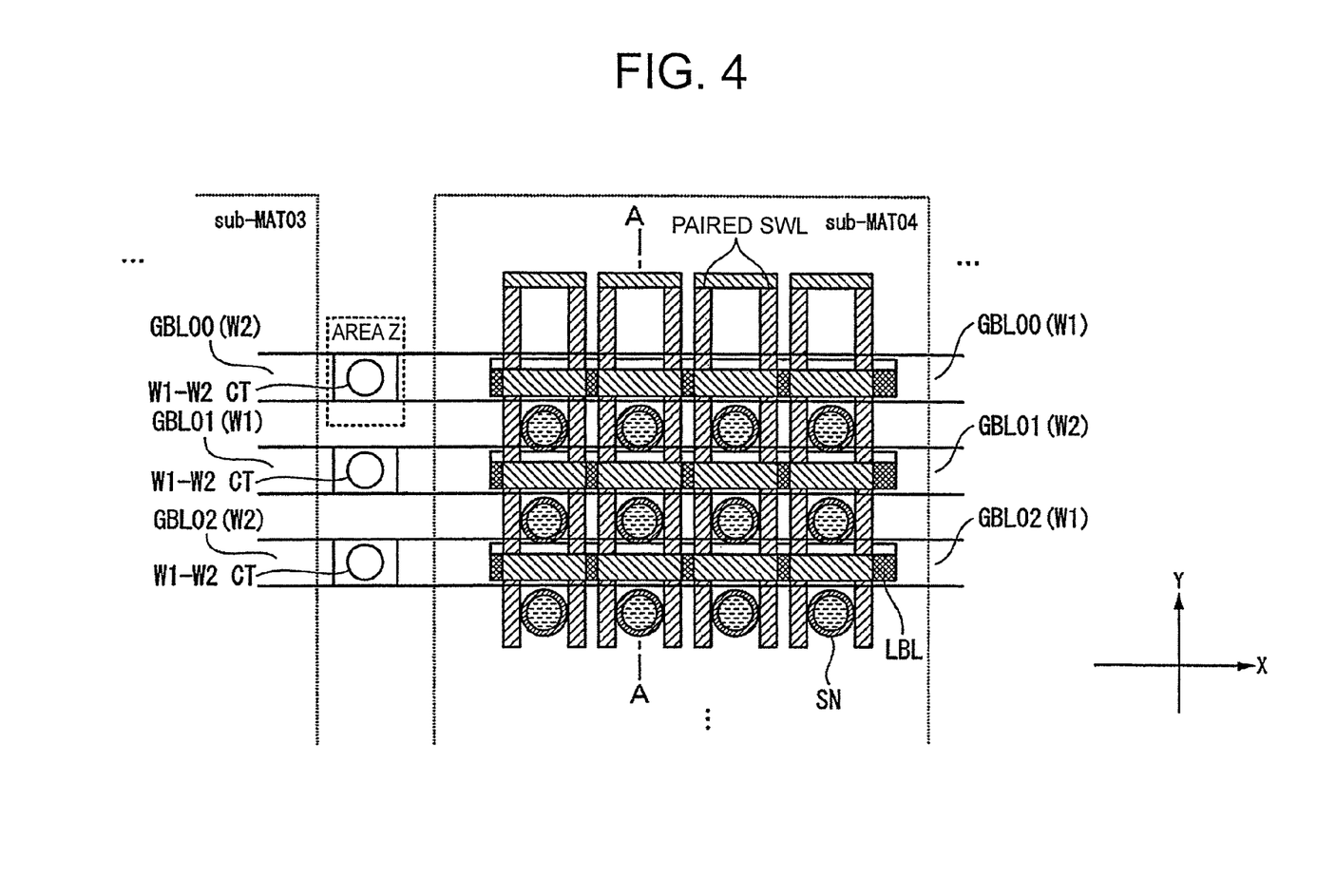
FIG. 4 is an enlarged plan view of a sub-memory mat area sub-MAT04.

Next, a multi-level wiring structure of a semiconductor device in the present embodiment will be described in detail with reference to FIGS. 4 to 6. FIG. 4 is an enlarged plan view of the sub-memory mat area sub-MAT04.

Specifically, FIG. 4 shows the sub-memory mat area sub-MAT04 illustrated in FIG. 2 and the sub-memory mat area sub-MAT03 adjacent to the sub-memory mat area sub-MAT04. FIG. 5 is a cross-sectional view of the sub-memory mat area sub-MAT04 taken along line A-A' (the Y-direction) of FIG. 4. FIG. 6 is a cross-sectional view showing a contact plug W1-W2 CT formed in an area Z illustrated in FIG. 4, which is taken along the Y-direction.

As shown in FIG. 4, the sub-memory mat area sub-MAT04 has a plurality of storage capacitors SN provided therein. Each of the storage capacitors SN is formed on a silicon pillar, which is formed by engraving a semiconductor substrate. The sub-word lines SWL, which form gate electrodes of transistors, and the local bit lines LBL are formed perpendicular to each other at different heights so that the silicon pillars are surrounded by the sub-word lines SWL and the local bit lines LBL. In other words, each of the sub-word lines SWL extends along the Y-direction, and each of the local bit lines LBL extends along the X-direction, which is perpendicular to the Y-direction, at a position lower than the position of the corresponding sub-word line SWL.

Furthermore, a transistor, which forms a memory cell MC along with a storage capacitor SN, includes one local bit line LBL and two sub-word lines SWL. Specifically, for one memory cell MC, two sub-word lines SWL form a gate electrode with a double gate (paired SWL) electrically connected to a silicon pillar via a gate oxide film. Meanwhile, for one memory cell MC, a local bit line LBL is electrically connected only to a silicon pillar located on one side via a bit contact (not shown) and is insulated from another silicon pillar located on the other side, the details of which will be described later.

Each of the global bit lines GBL extends along the same X-direction as the corresponding local bit line LBL at a position higher than the sub-word lines SWL on a plurality of sub-memory mat areas sub-MAT. For example, as shown in FIG. 4, the global bit line GBL00 extends along the X-direction over the sub-memory mat area sub-MAT03 and the sub-memory mat area sub-MAT04. Furthermore, a portion of the global bit line GBL00 that extends on the sub-memory mat area sub-MAT04 forms a global bit line GBL00(W1) in the first wiring layer W1, and a portion of the global bit line GBL00 that extends on the sub-memory mat area sub-MAT03 forms a global bit line GBL00(W2) in the second wiring layer W2.

In each of the global bit lines GBL, the first wiring layer W1 and the second wiring layer W2 are connected to each other via a contact plug W1-W2 CT formed in an area between the sub-memory mat area sub-MAT03 and the sub-memory mat area sub-MAT04. For example, for the global bit line GBL00, the global bit line GBL00(W1) extending on the sub-memory mat area sub-MAT04 and the global bit line GBL00(W2) extending on the sub-memory mat area sub-MAT03 are connected to each other via a contact plug W1-W2 CT formed in the area Z illustrated in FIG. 4. The details of structures and functions of the contact plugs W1-W2 CT and the global bit lines in the semiconductor device 10 will be described below in connection with a multi-level wiring structure of the semiconductor device 10.

First, the structure of the memory cells MC in the semiconductor device 10 will be described with reference to FIG. 5. In the present embodiment, the memory cells MC comprise a memory cell having what is called a 4F2 structure where F is the minimum size determined by the capability of an exposure apparatus. The memory cells MC have a structure in which a local bit line LBL and two sub-word lines SWL are embedded in a semiconductor substrate 13.

Figure 5:
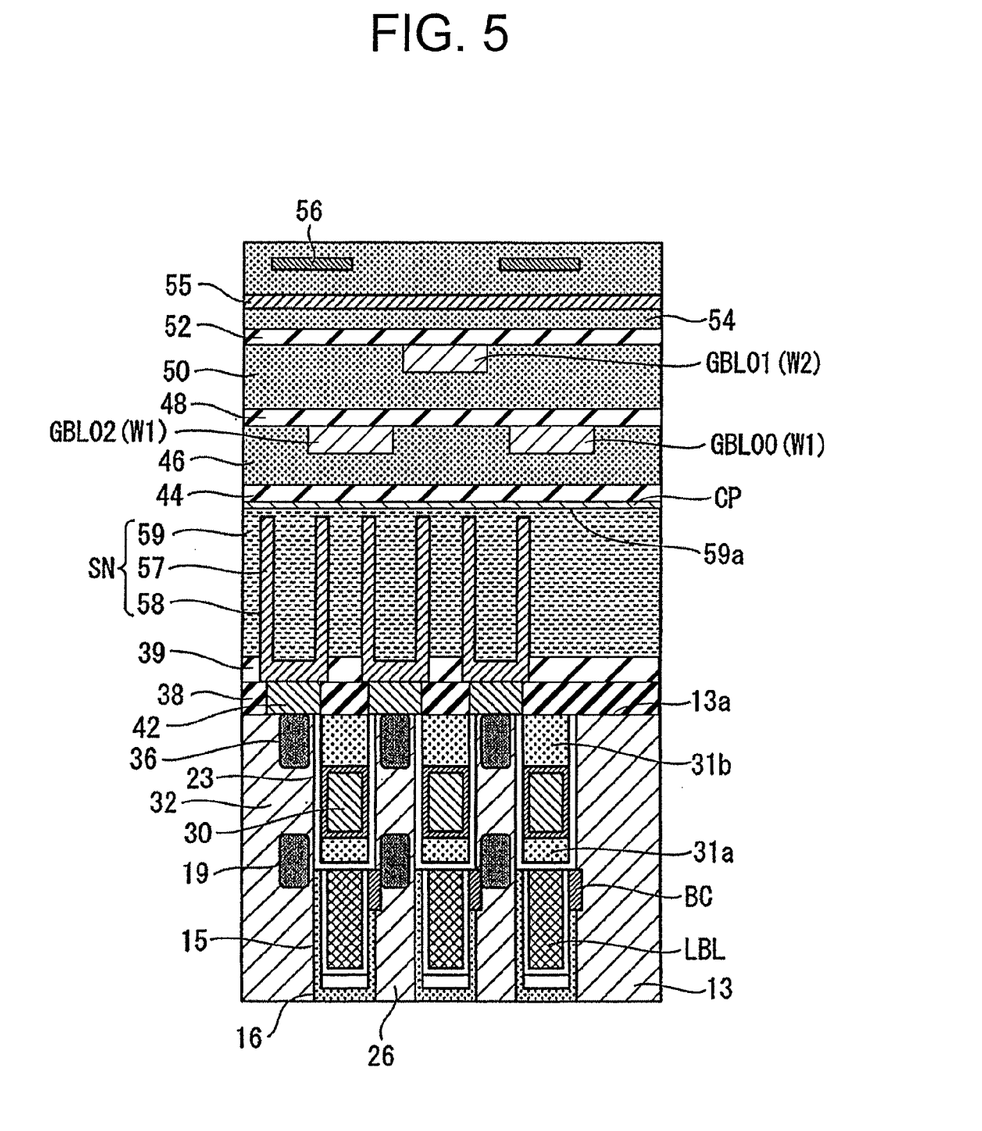
FIG. 5 is a cross-sectional view of the sub-memory mat area sub-MAT04 taken along line A-A' of FIG. 4 (Y-direction).

Referring to FIG. 5, bit line formation trenches 15 are formed in the semiconductor substrate 13. Each of the bit line formation trenches 15 extends along the X-direction (see FIG. 4), and a plurality of bit line formation trenches 15 are arranged in the Y-direction. An insulation film 16 is formed on portions of inner surfaces of the bit line formation trenches 15 on which the local bit lines LBL are to be formed. Specifically, the insulation film 16 is formed on bottoms and part of side surfaces of the bit line formation trenches 15.

The insulation film 16 has opening portions that allow part of sidewalls of the pillars to be exposed. A bit contact BC is formed in each of those opening portions. For example, a polycrystalline silicon film containing n-type impurities may be used as a material for the bit contacts BC.

Lower impurity diffusion regions 19 are formed in portions of the pillars 26 that contact the bit contacts BC. For example, the lower impurity diffusion regions 19 are formed as impurity diffusion regions containing n-type impurities. The lower impurity diffusion regions 19 function as drain regions.

The local bit lines LBL are formed on the bottoms of the bit line formation trenches 15 while the insulation film 16 is interposed between the local bit lines LBL and the bottoms of the bit line formation trenches 15. Each of the local bit lines LBL extends along the X-direction (see FIG. 4), and a plurality of local bit lines LBL are arranged in the Y-direction. The local bit lines LBL are formed of a conductive film. Each of the local bit lines LBL is brought into contact with the corresponding bit contact BC and is electrically connected to the corresponding lower impurity diffusion region 19 via the bit contact BC.

An insulation film 23 is formed so that upper surfaces of the local bit lines LBL and portions of the side surfaces of the bit line formation trenches 15 that are located above the local bit lines LBL are covered with the insulation film 23. A buried oxide film 31a is filled so that the buried oxide film 31a is embedded in the bit line formation trenches 15. Word line formation trenches (not shown) are formed above the buried oxide film 31a so as to cross the bit line formation trenches 15. In other words, each of the word line formation trenches extends along the Y-direction, and a plurality of word line formation trenches are arranged in the X-direction.

The following components are arranged in each of the word line formation trenches in the order named: a gate oxide film of a transistor connected to one of two sub-word lines SWL (hereinafter referred to a double gate), a gate electrode of the transistor, a gate electrode of a transistor connected to one word line of an adjacent double gate, and a gate electrode of the transistor. Furthermore, a trench for electrically isolating those two transistors, which will be referred to a word line isolation trench, is formed between the gate electrodes of the two transistors. The word line isolation trenches are formed deeper than the bit line formation trenches 15. An embedded insulation film formed of the same material as the buried oxide film 31a is filled in the word line isolation trenches up to the same height as an upper portion of connection portions 30. Another embedded insulation film formed of the same material as the buried oxide film 31a is also filled in the bit line formation trenches 15 up to the same height as the upper portion of connection portions 30.

The double gate is short-circuited in each of the bit line formation trenches 15. Specifically, the connection portion 30, which is provided for a double gate, is located between two word lines of the double gate in the bit line formation trench 15. A first end of the connection portion 30 in the X-direction is formed integrally with one word line of the double gate, and a second end of the connection portion 30 in the X-direction is formed integrally with the other word line of the double gate, which is not illustrated in FIG. 5. The connection portions 30 are provided to reduce a difference in electric resistance of the double gate in the Y-direction.

Meanwhile, the following components are arranged between two word line isolation trenches in the X-direction at areas other than bit line formation trenches 15, i.e., within the pillars 26 in the order named: a gate electrode of a transistor connected to one word line of a double gate, a gate oxide film of the transistor, a pillar 26, a gate oxide film of a transistor connected to the other word line of the double gate, and a gate oxide film of the transistor.

A buried oxide film 31b is provided to fill a portion of a bit line formation trench 15 that is located above the connection portion 30. Furthermore, in a world line isolation trench, a buried oxide film 31b is filled in upper portions of the double gate and the word line isolation trench that are located above the connection portions 30. Each of the buried oxide films 31b has an upper surface that is flat and flush with a primary surface 13a of the semiconductor substrate 13.

As described above, the bit line formation trenches 15 and the word line formation trenches are formed in the primary surface 13a of the semiconductor substrate 13. Thus, columnar pillars 26 are formed so that the pillars 26 are surrounded by those trenches. Upper impurity diffusion regions 36 are formed at upper ends of the pillars 26. Portions of the pillars 26 that are located between the upper impurity diffusion regions 36 and the lower impurity diffusion regions 19 serve as channel regions 32.

Thus, the upper impurity diffusion region 36, the lower impurity diffusion region 19, and the aforementioned gate oxide film, and the two gate electrodes of the double gate are provided so as to form a three-dimensional transistor of a vertical MOS transistor. The vertical MOS transistor has advantages in that it has a small space required and can obtain a large drain current due to full depletion. Therefore, each of the sub-memory mats can have the closest packed structure of 4F2 because it has a plurality of vertical MOS transistors as described above.

Referring to FIG. 5, a silicon oxide film 38 is formed so that a portion of an upper surface of the primary surface 13a of the semiconductor substrate 13 below which no upper impurity diffusion regions 36 are formed is covered with the silicon oxide film 38. A silicon nitride film 39 is formed on the silicon oxide film 38.

Furthermore, a silicon film 42 is formed on the upper impurity diffusion regions 36. The silicon film 42 is a conductive film. For example, the silicon film 42 includes a silicide layer at an upper portion thereof. Each of lower electrodes 57, which forms part of a storage capacitor SN, includes a silicide layer at a lower portion thereof. For example, when each of the lower electrodes 57 is a multilayer film in which a titanium (Ti) layer and a titanium nitride (TiN) layer are stacked, a titanium silicide layer is used as the silicide layer.

For example, each of the storage capacitors SN is a metal-insulation-metal (MIM) capacitor and is formed above the silicon film 42. One storage capacitor SN is provided for each of the pillars 26. Each of the storage capacitors SN includes a lower electrode 57, a capacitor insulation film 58, and an upper electrode 59, which covers surfaces of the capacitor insulation films 58 of the storage capacitors SN.

Each of the lower electrodes 57 is in the form of a cylinder having a bottom. The bottom of the cylinder is located on a lower side of the lower electrode 57, and an opening portion of the cylinder is located on an upper side of the lower electrode 57. The bottom of the cylinder is disposed above the corresponding upper impurity diffusion region 36.

The capacitor insulation film 58 is formed so as to cover all of inner surfaces and outer surfaces of the lower electrode 57 except a surface of the bottom of the cylinder that contacts the corresponding upper impurity diffusion region 36.

The upper electrode 59 is filled so as to cover the inner surfaces and the outer surfaces of the lower electrodes 57 and an upper surface of the silicon nitride film 39 while the capacitor insulation films 58 are interposed between the upper electrode 59 and the lower electrodes 57. The upper electrode 59 has an upper surface 59a that is flat. Thus, the upper electrode 59 forms a cell plate electrode CP provided above the lower electrodes 57 (storage nodes) while the capacitor insulation films 58 are interposed between the upper electrode 59 and the lower electrodes 57. The cell plate electrode CP is supplied with a voltage from a reference voltage generation circuit (not shown) provided as a peripheral circuit. During a writing operation of the semiconductor device 10, a voltage is applied to the storage nodes via the vertical MOS transistors. Thus, each of the storage capacitors SN stores a charge produced by multiplying a differential voltage between the applied voltage and a voltage of the cell plate electrode CP by a capacitance value of the storage capacitor SN.

A silicon nitride film 44 is formed evenly on the upper surface 59a of the upper electrode 59, i.e., above the cell plate electrode CP. An interlayer insulation film 46 is formed on the silicon nitride film 44.

A global bit line GBL00(W1) and a global bit line GBL02(W1) are formed at upper portions of the interlayer insulation film 46. The global bit line GBL00(W1) extends in parallel to the corresponding local bit line LBL along the X-direction. Furthermore, the global bit line GBL02(W1) extends in parallel to the corresponding local bit line LBL along the X-direction. For example, those global bit lines are formed of a tungsten layer W1 (lower-level wiring layer), which is a conductive layer.

A silicon nitride film 48 is formed evenly on the tungsten layer W1 and the interlayer insulation film 46. An interlayer insulation film 50 is formed on the silicon nitride film 48.

A global bit line GBL01(W2) is formed at an upper portion of the interlayer insulation film 50. The global bit line GBL01(W2) extends in parallel to corresponding local bit line LBL along the X-direction. For example, this global bit line is formed of a tungsten layer W2 (upper-level wiring layer), which is a conductive layer, as with the tungsten layer W1 (lower-level wiring layer).

A silicon nitride film 52 is formed evenly on the tungsten layer W2 and the interlayer insulation film 50. An interlayer insulation film 54 is formed on the silicon nitride film 52.

The interlayer insulation film 54 includes wires 55 disposed at lower portions thereof. For example, the wires 55 are formed of an aluminum layer, which is a conductive layer. The wires 55 extend perpendicular to the global bit lines, i.e., along the Y-direction in FIG. 4. For example, the wires 55 are used to transmit main word signals to be decoded that are inputted to sub-word line drivers of each of the sub-word line driver areas SWD (see FIG. 2).

Furthermore, the interlayer insulation film 54 includes wires 56 disposed at upper portions thereof. For example, the wires 56 are formed of an aluminum layer, which is a conductive layer, as with the wire 55. The wires 56 extend in parallel to the global bit lines, i.e., along the X-direction indicated in FIG. 4. For example, the wires 56 are used to transmit output signals (column selection signals) of the Y-decoder 7c (see FIG. 1). The column selection signals are used to open and close column switches (not shown) for connecting the global bit lines to and disconnected the global bit lines from IO lines (not shown) for transmitting amplification results of the sense amplifiers SA to the data amplifiers. The column selection signals are generated according to the column addresses and outputted to the column switches by the Y-decoder 7c.

Next, the structure of the global bit lines will be described with reference to FIG. 6. FIG. 6 is a cross-sectional view showing the contact plug W1-W2 CT formed in the area Z illustrated in FIG. 4, which is taken along the Y-direction. In FIG. 6, the same components as those in FIG. 5 are denoted by the same reference numerals, and the explanation thereof is omitted herein.

Figure 6:
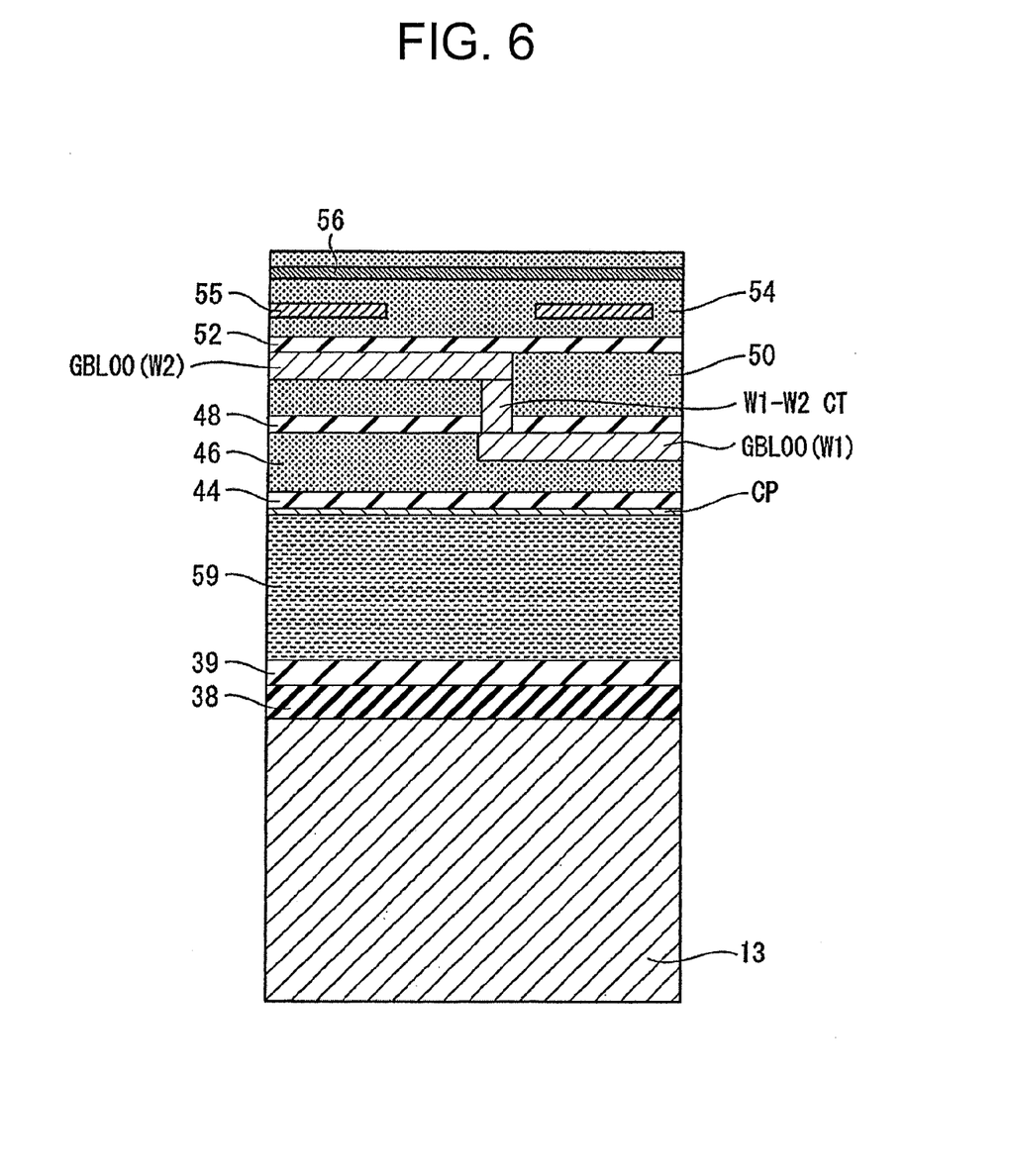
FIG. 6 is a cross-sectional view showing a contact plug W1-W2 CT formed in an area Z illustrated in FIG. 4, which is taken along the Y-direction.

As shown in FIG. 6, the contact plug W1-W2 CT is provided so as to extend through the silicon nitride film 48 and the interlayer insulation film 50. The contact plug W1-W2 CT connects the global bit line GBL00(W2) and the global bit line GBL01(W1) to each other.

Referring back to FIG. 4, for each of other global bit lines, the tungsten layer W1 is connected to the tungsten layer W2 by the contact plug W1-W2 CT in a dedicated area formed between the sub-memory mat area sub-MAT03 and the sub-memory mat area sub-MAT04. Specifically, the global bit line GBL01, which is disposed adjacent to the global bit line GBL00, is formed of a tungsten layer W1 in the sub-memory mat area sub-MAT_10 and of a tungsten layer W2 in the sub-memory mat area sub-MAT_11. This tungsten layer W1 is connected to the tungsten layer W2 by a contact plug W1-W2 CT.

Furthermore, the global bit line GBL02, which is disposed adjacent to the global bit line GBL01, is formed of a tungsten layer W2 in the sub-memory mat area sub-MAT_10 and of a tungsten layer W1 in the sub-memory mat area sub-MAT_11. This tungsten layer W2 is connected to the tungsten layer W1 by a contact plug W1-W2 CT.

Thus, a tungsten layer W1 and a tungsten layer W2 are connected to each other between adjacent global bit lines by a contact plug W1-W2 CT. Assuming that the global bit line GBL00 is defined as the first global bit line, an odd global bit line is formed of a tungsten layer W2 in the sub-memory mat area sub-MAT_10 and of a tungsten layer W1 in the sub-memory mat area sub-MAT_11. This tungsten layer W2 is connected to the tungsten layer W1 by a contact plug W1-W2 CT. Furthermore, an even global bit line is formed of a tungsten layer W1 in the sub-memory mat area sub-MAT_10 and of a tungsten layer W2 in the sub-memory mat area sub-MAT_11. This tungsten layer W1 is connected to the tungsten layer W2 by a contact plug W1-W2 CT. The wiring layers in which the global bit lines GBL are provided are not limited to those examples. For example, the global bit lines GBL may be provided in the wiring layer in which the wires 55 and the wires 56 are formed as shown in FIGS. 5 and 6.

Figure 7:
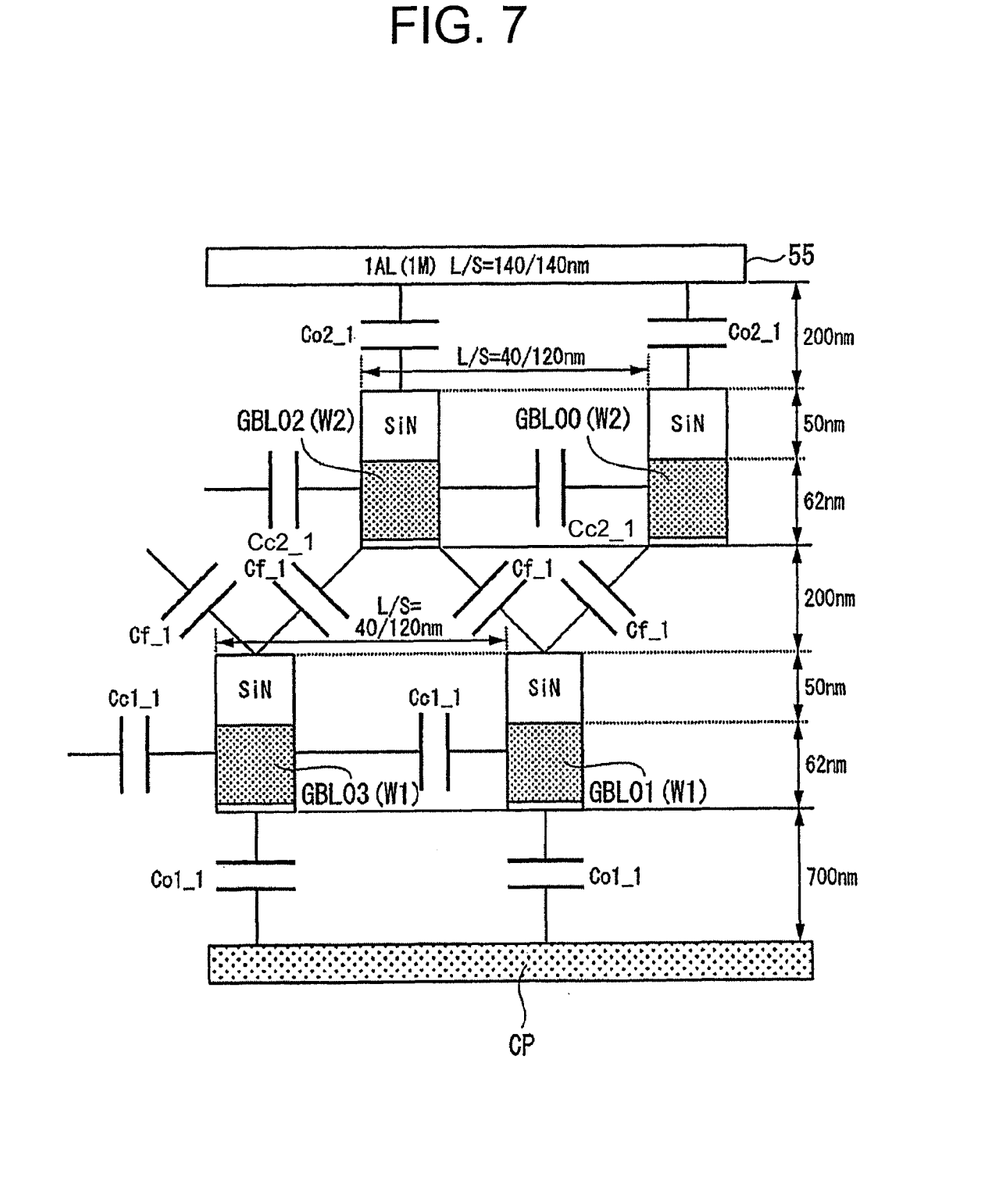
FIG. 7 is a diagram explanatory of the capacitance of global bit lines in a sub-memory mat area sub-MAT_10.
Figure 8:
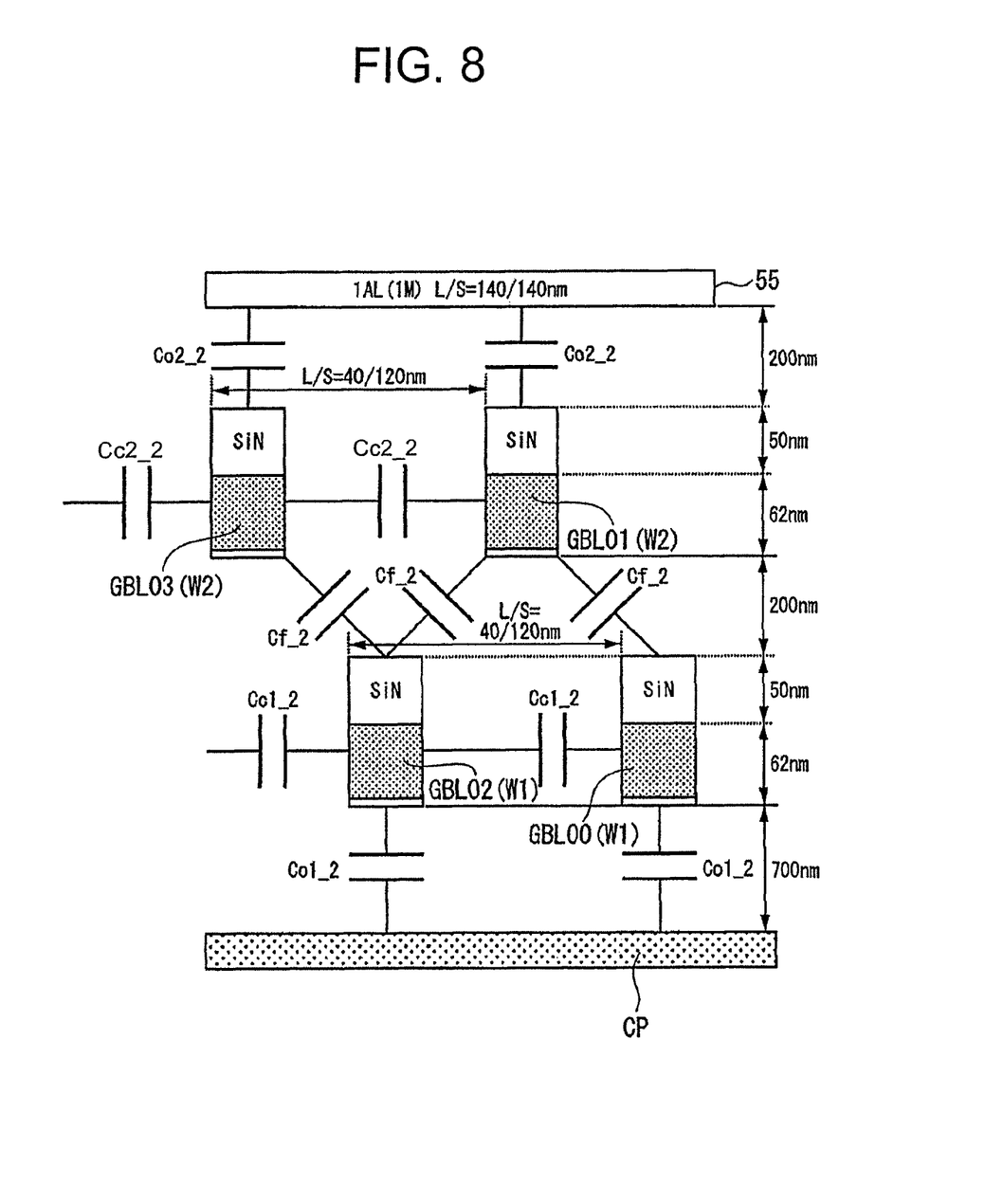
FIG. 8 is a diagram explanatory of the capacitance of global bit lines in a sub-memory mat area sub-MAT_11.

Next, the capacitance of the global bit lines will be described with reference to FIGS. 7 and 8. FIG. 7 is a diagram explanatory of the capacitance of the global bit lines in the sub-memory mat area sub-MAT_10. FIG. 8 is a diagram explanatory of the capacitance of the global bit lines in the sub-memory mat area sub-MAT_ 11. FIGS. 7 and 8 are cross-sectional views of the memory mat Memory MAT1 taken along the Y-direction in FIG. 2. FIGS. 7 and 8 show a cross-sectional structure between an upper portion of the cell plate CP and the wire 55 (see FIG. 5). On the right sides of FIGS. 7 and 8, the thickness of the insulation films and the wiring layers in a direction of height is represented by nanometers (nm). In FIGS. 7 and 8, the widths and intervals (line-and-space (L/S) patterns) of finished conductive layers after production of the semiconductor device 10 are represented by nanometers (nm).

In FIGS. 7 and 8, the capacitance of the global bit lines is explained as follows: A capacitance $Cc1\_1$ and a capacitance $Cc1\_2$ represent a capacitance between a lower-level wiring layer of a global bit line and an adjacent lower-level wiring layer of another global bit line, i.e., a side coupling capacitance. Furthermore, a capacitance Co1_1 and a capacitance Co1_2 represent a capacitance between a lower-level wiring layer of a global bit line and the cell plate CP, i.e., an overlap capacitance. A capacitance Cc2_1 and a capacitance Cc2_2 represent a side coupling capacitance between an upper-level wiring layer of a global bit line and an adjacent upper-level wiring layer of another global bit line. Furthermore, a capacitance Co2_1 and a capacitance Co2_2 represent an overlap capacitance between an upper-level wiring layer of a global bit line and the wire 55. A capacitance Cf_1 and a capacitance Cf_2 represent a fringe capacitance between an upper-level wiring layer of a global bit line and a lower-level wiring layer of a global bit line located below the upper-level wiring layer.

In FIGS. 7 and 8, no side coupling capacitance or fringe capacitance is illustrated on the right side of the global bit line GBL00 and the global bit line GBL01. Nevertheless, for example, a dummy wire having the same film thickness and L/S pattern as the global bit line may be formed so as to provide such capacitances. Thus, the capacitance of the global bit line GBL00 and the global bit line GBL01 may be made equal to the capacitance of inside global bit lines.

With regard to the global bit line GBL02, for example, the capacitance of the global bit line GBL02 is explained as follows: As shown in FIG. 7, the capacitance of the global bit line GBL02(W2) in the sub-memory mat area sub-MAT_10 is the sum of a capacitance Co2_1, two capacitances Cc2_1, and two capacitances Cf_1. As shown in FIG. 8, the capacitance of the global bit line GBL02(W1) in the sub-memory mat area sub-MAT_11 is the sum of a capacitance Co1_2, two capacitances Cc1_2, and two capacitances Cf_2.

With regard to the global bit line GBL03 adjacent to the global bit line GBL02, the capacitance of the global bit line GBL03 is explained as follows: As shown in FIG. 7, the capacitance of the global bit line GBL03(W1) in the sub-memory mat area sub-MAT 10 is the sum of a capacitance Co1_1, two capacitances Cc1_1, and two capacitances Cf_1. As shown in FIG. 8, the capacitance of the global bit line GBL03(W2) in the sub-memory mat area sub-MAT_11 is the sum of a capacitance Co2_2, two capacitances Cc2_2, and two capacitances Cf_2.

Since the global bit lines have the same L/S patterns, the side coupling capacitances of the capacitance Cc1_1, the capacitance Cc2_1, the capacitance Cc1_2, and the capacitance Cc2_2 have the same value per unit length along the global bit lines. Since the insulation films between the upper-level wiring layers and the lower-level wiring layers of the global bit lines have the same film thickness, the fringe capacitances of the capacitance Cf_1 and the capacitance Cf_2 have the same value per unit length along the global bit lines.

Since the insulation films between the lower-level wiring layers of the global bit lines and the cell plate CP and the insulation films between the upper-level wiring layers of the global bit lines and the wire 55 have different film thicknesses of 700 nm and 200 nm, respectively, the overlap capacitances of the capacitance Co1_1 and the capacitance Co1_2 and the overlap capacitances of the capacitance Co2_1 and the capacitance Co2_2 have different values per unit length along the global bit lines. However, the distances between counter electrodes (the film thicknesses of the insulation films) for the overlap capacitances are longer than the distances between counter electrodes (the wiring spaces or the film thicknesses of the insulation films) for the side coupling capacitances and the fringe capacitances. Therefore, ratios of the overlap capacitances to the overall capacitance of a global bit line in each area are low. Since each of the global bit lines extends in two divided layers of an upper-level wiring layer and a lower-level wiring layer, the side coupling capacitances and the fringe capacitances can be made equal to each other while the overlap capacitances cannot be made equal to those capacitances. Accordingly, the capacitance of adjacent global bit lines can be equalized.

For example, a contact plug W1-W2 CT is located at the central position in a direction in which the global bit line extends, and a distance between the upper-level wiring layer and the contact plug W1-W2 CT and a distance between the lower-level wiring layer and the contact plug W1-W2 CT are made equal to each other. Then the overlap capacitances of adjacent global bit lines can be made equal to each other. Therefore, variations in capacitance between adjacent global bit lines can further be reduced.

Adjacent global bit lines extend in two divided layers of an upper-level wiring layer and a lower-level wiring layer, respectively, so that they are not juxtaposed in the same wiring layer. If adjacent global bit lines are juxtaposed in the same wiring layer, they extend in parallel within a distance shorter than 120 nm as shown in FIGS. 7 and 8. Therefore, the side coupling capacitance of the global bit lines increases, so that input differential potentials to the sense amplifiers SA are lowered. Thus, a high-speed operation cannot be achieved. In contrast, according to the present invention, since adjacent global bit lines extend in two divided layers of an upper-level wiring layer and a lower-level wiring layer, respectively, the side coupling capacitance of the global bit lines can be reduced. Accordingly, a high-speed operation of the sense amplifiers SA can be achieved.

In this manner, the semiconductor device 10 has a first memory mat (sub-memory mat area sub-MAT_10) including a plurality of first memory cells and a second memory mat (sub-memory mat area sub-MAT_11) including a plurality of second memory cells. The second memory mat is arranged adjacent to the first memory mat. The semiconductor device 10 also has a first global bit line (global bit line GBL00) extending on the first memory mat and the second memory mat. The first global bit line is connected to a selected one of the first memory cells and the second memory cells. The semiconductor device 10 also has a multi-level wiring structure including a lower-level wiring layer (first wiring layer W1), an upper-level wiring layer (second wiring layer W2), and an interlayer insulation film (interlayer insulation film 50 or silicon nitride film 48) between the lower-level wiring layer and the upper-level wiring layer. The first global bit line (e.g., the global bit line GBL00) includes a first portion extending on the first memory mat (global bit line GBL00(W2)) and a second portion extending on the second memory mat (global bit line GBL00(W1)). The first portion is formed in one wiring layer of the lower-level wiring layer and the upper-level wiring layer (second wiring layer W2), and the second portion is formed in another wiring layer of the lower-level wiring layer and the upper-level wiring layer (first wiring layer W1).

Thus, according to the present invention, a main bit line (global bit line GBL00) is provided in two divided layers of the lower-level wiring layer and the upper-level wiring layer. Therefore, the capacitance of global bit lines can be equalized. Accordingly, no variations are produced in initial potential generated on adjacent two global bit lines by data read from memory cells. Since no variations are produced in initial potential, it becomes easy to match an operation margin of a sense amplifier connected to one of adjacent two global bit lines with an operation margin of a sense amplifier connected to the other global bit line. Consequently, sense amplifiers can readily be designed even if an operation speed of the semiconductor device increases.

Furthermore, in the semiconductor device 10, the first memory mat further includes a plurality of third memory cells, and the second memory mat further includes a plurality of fourth memory cells. The semiconductor device 10 also has a second global bit line (e.g., global bit line GBL01) extending adjacent to the first global bit line (global bit line GBL00) on the first memory mat and the second memory mat. The second global bit line is connected to a selected one of the third memory cells and the fourth memory cells. The second global bit line includes a third portion extending on the first memory mat (global bit line GBL01(W1)) and a fourth portion extending on the second memory mat (global bit line GBL01(W2)). The third portion is formed in one wiring layer of the lower-level wiring layer and the upper-level wiring layer (first wiring layer W1), and the fourth portion is formed in another wiring layer of the lower-level wiring layer and the upper-level wiring layer (second wiring layer W2).

Thus, since adjacent global bit lines extend in two divided layers of an upper-level wiring layer and a lower-level wiring layer, respectively, the side coupling capacitance of the global bit lines can be reduced. Accordingly, a high-speed operation of the sense amplifiers SA can be achieved.

The technical concept of the present invention is applicable to any semiconductor device having a memory function. Circuit configurations of the illustrated circuit blocks and other circuits for generating control signals are not limited to the disclosed ones in the above embodiment.

For example, the number of memory mats and the number of global bit lines are not limited to specific values. Furthermore, the number of sub-word lines in a sub-memory mat area sub-MAT, i.e., the number of memory cells on a local bit line LBL is 128 in FIG. 2 but is not limited to 128.

Figure 9:
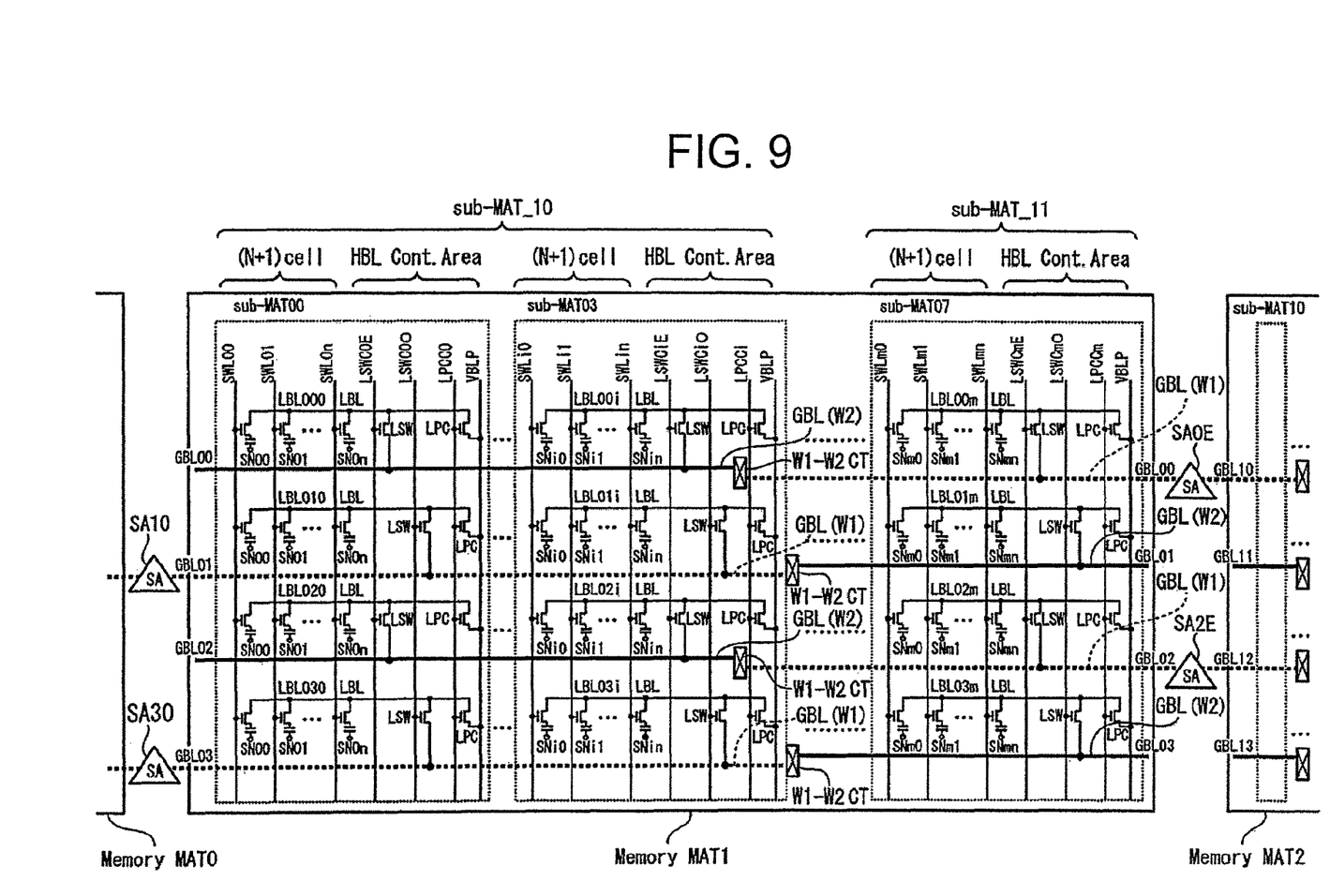
FIG. 9 is a detailed circuit diagram showing another example of the memory mat Memory MAT1 illustrated in FIG. 2.

In the above embodiment, the contact plugs W1-W2 CT are provided in dedicated areas formed between the sub-memory mat area sub-MAT03 and the sub-memory mat area sub-MAT04 (see FIG. 3). However, no dedicated areas may be provided. FIG. 9 is a detailed circuit diagram showing another example of the memory mat Memory MAT1 illustrated in FIG. 2. A contact plug W1-W2 CT connects a tungsten layer W1 and a tungsten layer W2 to each other between adjacent global bit lines in the following manner. Assuming that the global bit line GBL00 is defined as the first global bit line, a contact plug W1-W2 CT is provided in a switching circuit area HBL Cont. Area of the sub-memory mat area sub-MAT03 for an odd global bit line. An odd global bit line is formed of a tungsten layer W2 in the sub-memory mat area sub-MAT_10 and of a tungsten layer W1 in the sub-memory mat area sub-MAT_11. This tungsten layer W2 is connected to the tungsten layer W1 by a contact plug W1-W2 CT. Furthermore, a contact plug W1-W2 CT is provided in a switching circuit area HBL Cont. Area of the sub-memory mat area sub-MAT04 for an even global bit line (see FIG. 2). An even global bit line is formed of a tungsten layer W1 in the sub-memory mat area sub-MAT_10 and of a tungsten layer W2 in the sub-memory mat area sub-MAT_11. This tungsten layer W1 is connected to the tungsten layer W2 by a contact plug W1-W2 CT. Thus, an area of the memory mat Memory MAT can be reduced without provision of dedicated areas for those contact plugs W1-W2 CT.

The technical concept of a semiconductor device according to the present invention is applicable to various types of semiconductor devices.

For example, the present invention is applicable to general semiconductor devices such as a central processing unit (CPU), a micro control unit (MCU), a digital signal processor (DSP), an application specific integrated circuit (ASIC), an application specific standard product (ASSP), and a memory.

Furthermore, examples of semiconductor devices to which the present invention can be applied include semiconductor devices using technology including system-on-a-chip (SOC), multi-chip package (MCP), and package-on-package (POP). The present invention is applicable to any semiconductor device having such product forms or package forms.

Moreover, transistors used should be a field effect transistor (FET). However, various types of FETs including a metal oxide semiconductor (MOS), a metal-insulator semiconductor (MIS), and a thin film transistor (TFT) may be used for such transistors. Furthermore, the semiconductor device may include some bipolar transistors.

Furthermore, an N-type channel MOS transistor (NMOS transistor) is a typical example of a first conductive type of transistors, and a P-type channel transistor (PMOS transistor) is a typical example of a second conductive type of transistors.

The disclosed elements may be combined or selected in various ways within the scope of the appended claims of the present invention. In other words, the present invention includes a variety of changes and modifications that would be apparent to those skilled in the art from the entire disclosure and technical concept including the appended claims.

What is claimed is:

1. A semiconductor device comprising:
a first memory mat comprising a plurality of first memory cells;
a second memory mat comprising a plurality of second memory cells;
a first global bit line extending over the first memory mat and the second memory mat; and
a second global bit line extending over the first memory mat and the second memory mat;
a multi-level wiring structure comprising a lower-level wiring, an upper-level wiring, and an interlayer insulation film between the lower-level wiring and the upper-level wiring;
wherein:
the first memory mat further comprises:
a plurality of third memory cells;
a first local bit line connected to the plurality of first memory cells;
a third local bit line connected to the plurality of third memory cells;
a first control signal line which controls a first switching element connecting between
the first local bit line and the first global bit line; and
a third control signal line which controls a third switching element connecting between
the third local bit line and the second global bit line;
the second memory mat further comprises:
a plurality of fourth memory cells;
a second local bit line connected to the plurality of second memory cells;
a fourth local bit line connected to the plurality of fourth memory cells;
a second control signal line which controls a second switching element connecting
between the second local bit line and the first global bit line; and
a fourth control signal line which controls a fourth switching element connecting
between the fourth local bit line and the second global bit line;
the first global bit line comprises a first portion over the first memory mat and a second portion over the second memory mat, the first portion being formed as the lower-level wiring, and the second portion being formed as the upper-level wiring;

the second global bit line comprises a third portion over the first memory mat and a fourth portion over the second memory mat, the third portion being formed as the upper-level wiring, the fourth portion being formed as the lower-level wiring;

the second global bit line is operatively connected to a selected one of the plurality of third memory cells and the plurality of fourth memory cells;

the first memory mat comprises a first precharge circuit precharging the first local bit line to a predetermined precharge potential and a second precharge circuit precharging the third local bit line to the precharge potential; and the second memory mat comprises a third precharge circuit precharging the second local bit line to the precharge potential and a fourth precharge circuit precharging the fourth local bit line to the precharge potential.

2. The semiconductor device as recited in claim 1, wherein the first global bit line comprises a contact plug penetrating the interlayer insulation film to connect the first portion and the second portion to each other.

3. The semiconductor device as recited in claim 1, wherein the second global bit line comprises a second contact penetrating the interlayer insulation film to connect the third portion and the fourth portion to each other.

4. The semiconductor device as recited in claim 1, wherein the first portion and the second portion of the first global bit line and the third portion and the fourth portion of the second global bit line are substantially the same in length as one another.

5. A semiconductor device comprising:
   a first memory mat that includes:
      first and second sub-mats,
      first and second local bit lines provided for the first and second sub-mats, respectively, and
      first and second sets of memory cells connected to the first and second local bit lines, respectively;
   a multi-level wiring structure including a lower-level wiring, an upper-level wiring and an interlayer insulating film between the lower-level wiring and the upper-level wiring;
   a first global bit line crossing over the first memory mat, the first global bit line including a first portion over the first sub-mat to be operatively connected to the first local bit line and a second portion over the second sub-mat to be operatively connected to the second local bit line, the first portion being formed as the lower-level wiring, and the second portion being formed as the upper-level wiring;
   a second memory mat that includes:
      third and fourth sub-mats,
      third and fourth local bit lines provided for the third and fourth sub-mats, respectively, and
      third and fourth sets of memory cells connected to the third and fourth local bit lines, respectively;
   a second global bit line crossing over the second memory mat, the second global bit line including a third portion over the third sub-mat to be operatively connected to the third local bit line and a fourth portion over the fourth sub-mat to be operatively connected to the fourth local bit line, the third portion being formed as the lower-level wiring, and the fourth portion being formed as the upper-level wiring; and
   a first sense amplifier provided between the first and second memory mats and including first and second sense nodes connected to the first and second global bit lines, respectively
   wherein the first memory mat further includes fifth and sixth local bit lines provided for the first and second sub-mats, respectively, and fifth and sixth sets of memory cells connected to the fifth and sixth local bit lines, respectively;
   wherein the second memory mat further includes seventh and eighth local bit lines provided for the third and fourth sub-mats, respectively, and seventh and eighth sets of memory cells connected to the seventh and eighth local bit lines, respectively; and
   wherein the device further comprises:
      a third global bit line crossing over the first memory mat in substantially parallel to the first global bit line, the third global bit line including a fifth portion over the first sub-mat to be operatively connected to the fifth local bit line and a sixth portion over the second sub-mat to be operatively connected to the sixth local bit line, the fifth portion being formed as the upper-level wiring, the sixth portion being formed as the lower-level wiring,
      a fourth global bit line crossing over the second memory mat in substantially parallel to the second global bit line, the fourth global bit line including a seventh portion over the third sub-mat to be operatively connected to the seventh local bit line and an eighth portion over the fourth sub-mat to be operatively connected to the eighth local bit line, the seventh portion being formed as the upper-level wiring, the eighth portion being formed as the lower-level wiring, and
      second and third sense amplifiers arranged such that the first and second memory mats are disposed between the second and third sense amplifiers, the third and fourth global bit lines being connected to the second and third sense amplifiers, respectively.

6. The device as claimed in claim 5,
   wherein the first memory mat further includes third and fourth local bit lines provided for the first and second sub-mats, respectively, and third and fourth sets of memory cells connected to the third and fourth local bit lines, respectively;
   wherein the device further comprises a second global bit line that crosses over the first memory mat in substantially parallel to the first global bit line, the second global bit line including a third portion over the first sub-mat to be operatively connected to the third local bit line and a fourth portion over the second sub-mat to be operatively connected to the fourth local bit line, the third portion being formed as the upper-level wiring, and the fourth portion being formed as the lower-level wiring.

7. The device as claimed in claim 5, wherein the first sub-mat is between the second sub-mat and the first sense amplifier and the third sub-mat is between the fourth sub-mat and the first sense amplifier.

8. The device as claimed in claim 5, wherein
   the first sub-mat is between the second sub-mat and the first sense amplifier;
   the third sub-mat is between the fourth sub-mat and the first sense amplifier;
   the sixth sub-mat is between the fifth sub-mat and the second sense amplifier; and
   the eighth sub-mat is between the seventh sub-mat and the third sense amplifier.

9. The device as claimed in claim 8, further comprising first, second, third and fourth contact plugs, the first contact plug penetrating the interlayer insulating film to connect the first and second portions in series to each other, the second contact plug penetrating the interlayer insulating film to connect the third and fourth portions in series to each other, the third contact plug penetrating the interlayer insulating film to connect the fifth and sixth portions in series to each other, and the fourth contact plug penetrating the interlayer insulating film to connect the seventh and eighth portions in series to each other.

* * * * *